(12) United States Patent
Ghinovker et al.

(10) Patent No.: US 12,094,100 B2
(45) Date of Patent: Sep. 17, 2024

(54) MEASUREMENT OF STITCHING ERROR USING SPLIT TARGETS

(71) Applicant: KLA Corporation, Milpitas, CA (US)

(72) Inventors: Mark Ghinovker, Yoqneam Ilit (IL); Yoel Feler, Haifa (IL)

(73) Assignee: KLA Corporation, Milpitas, CA (US)

( * ) Notice: Subject to any disclaimer, the term of this patent is extended or adjusted under 35 U.S.C. 154(b) by 373 days.

(21) Appl. No.: 17/686,382

(22) Filed: Mar. 3, 2022

(65) Prior Publication Data

US 2023/0281779 A1 Sep. 7, 2023

(51) Int. Cl.
| | |
|---|---|
| *G06T 7/68* | (2017.01) |
| *G03F 9/00* | (2006.01) |
| *G06T 7/00* | (2017.01) |
| *G06T 7/73* | (2017.01) |
| *H01L 21/027* | (2006.01) |

(52) U.S. Cl.
CPC .......... *G06T 7/0004* (2013.01); *G03F 9/7092* (2013.01); *G06T 7/68* (2017.01); *G06T 7/73* (2017.01); *G06T 2207/30148* (2013.01); *H01L 21/0274* (2013.01)

(58) Field of Classification Search
CPC ........... G06T 7/0004; G06T 7/68; G06T 7/73; G06T 2207/30148; G03F 9/7092; H01L 21/0274
USPC ................................................. 382/100, 151
See application file for complete search history.

(56) References Cited

U.S. PATENT DOCUMENTS

| | | | |
|---|---|---|---|
| 2012/0082937 A1 | 4/2012 | Fabinski et al. | |
| 2020/0166853 A1 | 5/2020 | Eugeni | |
| 2020/0348587 A1 | 11/2020 | Mekking et al. | |
| 2021/0174483 A1 | 6/2021 | Zhang et al. | |
| 2021/0200105 A1* | 7/2021 | Leshinsky-Altshuller | ........... G03F 1/42 |
| 2022/0050393 A1 | 2/2022 | Devilliers | |

FOREIGN PATENT DOCUMENTS

| | | | | |
|---|---|---|---|---|
| CN | 109786239 A | * | 5/2019 | ............... G03F 1/42 |
| WO | 2023136845 A1 | | 7/2023 | |

OTHER PUBLICATIONS

WIPO, International Search Report for International Application No. PCT/US2022/026083, Nov. 23, 2022.
WIPO, Written Opinion of the International Searching Authority for International Application No. PCT/US2022/026083, Nov. 23, 2022.

* cited by examiner

*Primary Examiner* — Sheela C Chawan

(74) *Attorney, Agent, or Firm* — Hodgson Russ LLP

(57) ABSTRACT

A method of semiconductor metrology includes patterning a film layer on a semiconductor substrate to define a first field on the semiconductor substrate with a first pattern comprising at least a first target feature within a first margin along a first edge of the first field and to define a second field, which abuts the first field, with a second pattern comprising at least a second target feature within a second margin along a second edge of the second field, such that the second edge of the second field adjoins the first edge of the first field. The first target feature in the first margin is adjacent to the second target feature in the second margin without overlapping the second target feature. An image is captured of at least the first and second target features and is processed to detect a misalignment between the first and second fields.

22 Claims, 10 Drawing Sheets

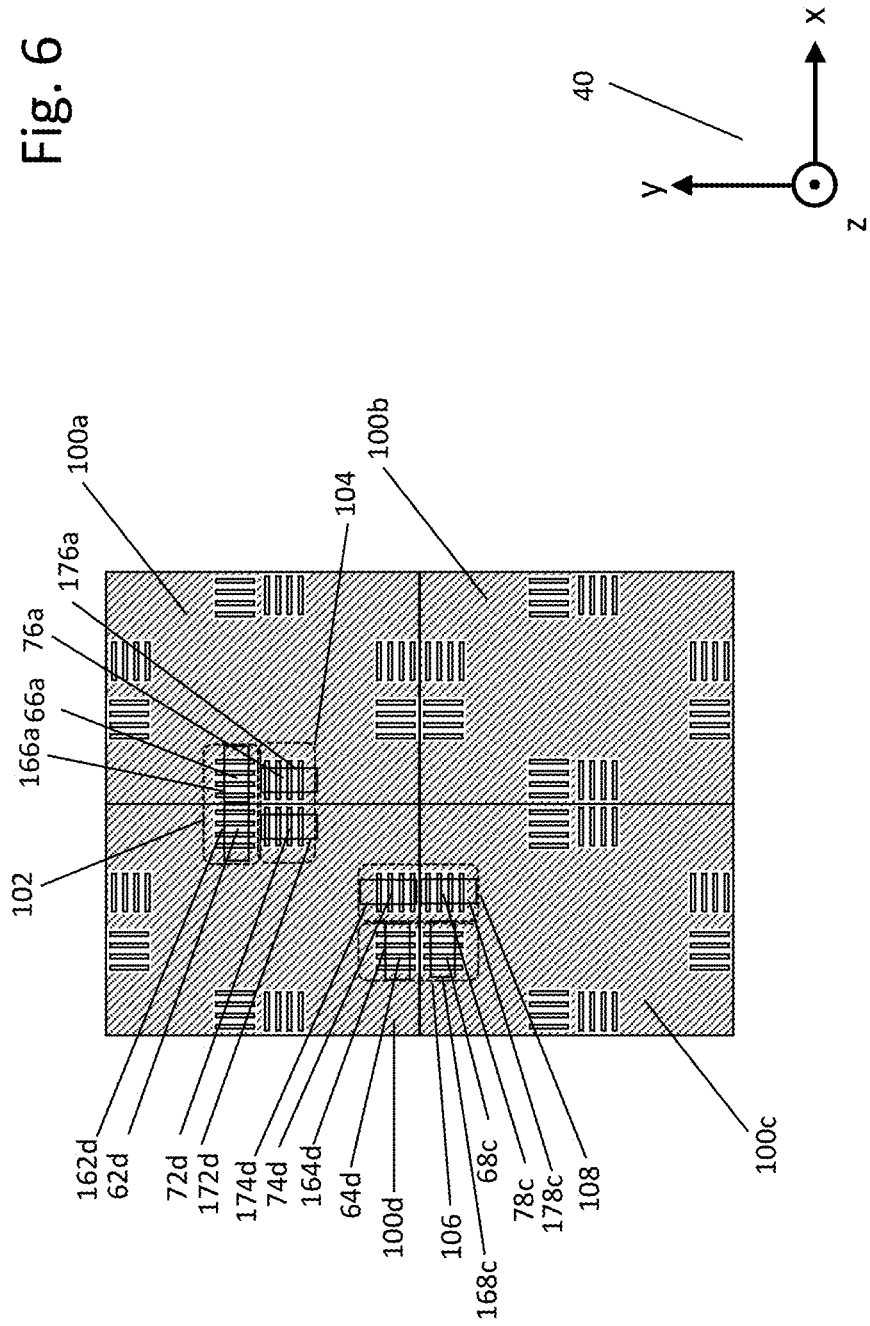

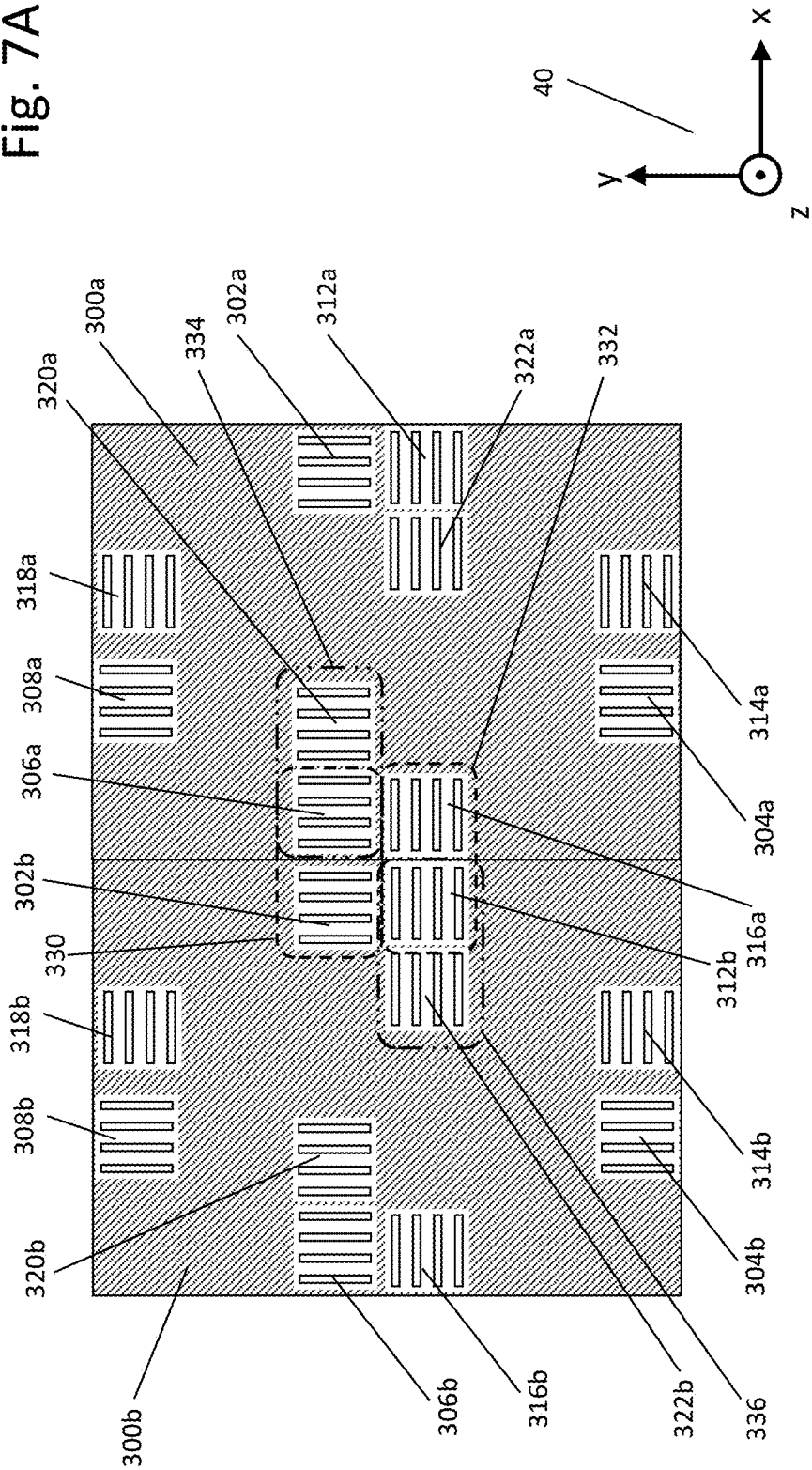

MEASUREMENT OF STITCHING ERROR USING SPLIT TARGETS

FIELD OF THE INVENTION

The present invention relates generally to manufacture of semiconductor devices, and particularly to methods and target features for semiconductor circuit metrology.

BACKGROUND

Semiconductor circuits are commonly manufactured using photolithographic methods. In the photolithographic process, a thin layer of a photosensitive polymer (photoresist) is deposited over a semiconductor substrate. The photoresist is patterned by an exposure system, typically comprising a scanner or a stepper, which projects an image of a mask (also termed a "photomask" or "reticle") onto the photoresist, typically using ultraviolet radiation. The extent of the image of the reticle defines an exposure field on the substrate. Multiple fields are typically exposed on a single semiconductor substrate for optimal utilization of the substrate. After patterning, the substrate is modified by methods such as etching and ion bombardment to change the material properties and/or the topography of the substrate, while the parts of the substrate covered by the photoresist are not affected.

The exposure field of a scanner typically comprises one or more dies, wherein each die will be used to produce a corresponding integrated circuit. However, in some applications a single circuit may require dimensions that are larger than a single exposure field. In this case, a single die may comprise two or more adjacent exposure fields, with patterned circuit features connecting the neighboring fields within the die. Patterning a semiconductor substrate so that circuit features of adjacent fields connect is commonly called "field stitching" or simply "stitching."

Some methods have been proposed for measuring misalignment between neighboring fields. For example, U.S. Patent Application Publication 2021/0200105 describes a metrology system including a controller to receive a first metrology dataset associated with a first set of metrology target features on a sample including first features from a first exposure field on a first sample layer and second features from a second exposure field on a second sample layer, where the second exposure field partially overlaps the first exposure field. The controller may further receive a second metrology dataset associated with a second set of metrology target features including third features from a third exposure field on the second layer that overlaps the first exposure field and fourth features formed from a fourth exposure field on the first layer of the sample that overlaps the second exposure field. The controller may further determine fabrication errors based on the first and second metrology datasets and generate correctables to adjust a lithography tool based on the fabrication errors.

SUMMARY

Embodiments of the present invention that are described hereinbelow provide improved methods and systems for metrology of patterned semiconductor wafers, as well as targets for use in such methods.

There is therefore provided, in accordance with an embodiment of the invention, a method of semiconductor metrology, which includes patterning a film f layer on a semiconductor substrate to define a first field on the semiconductor substrate with a first pattern including at least a first target feature within a first margin along a first edge of the first field. The film layer on the semiconductor substrate is patterned to define a second field, which abuts the first field, with a second pattern including at least a second target feature within a second margin along a second edge of the second field, such that the second edge of the second field adjoins the first edge of the first field, and the first target feature in the first margin is adjacent to the second target feature in the second margin without overlapping the second target feature. An image is captured of an area of the patterned film layer including at least the first and second target features. The image is processed to detect a misalignment between the first and second fields.

In a disclosed embodiment, processing the image includes finding respective first and second centers of symmetry of the first target feature and the second target feature, measuring a displacement between the first and second centers of symmetry, and detecting the misalignment by comparing the measured displacement to a nominal displacement.

In some embodiments, the first and second target features respectively include first and second linear gratings, which are oriented along a common grating direction. In one such embodiment, the first and second linear gratings are oriented along a first grating direction, and wherein patterning the film layer includes forming third and fourth target features along the first edge of the first field and the second edge of the second field, respectively, within the margin on opposing first and second sides of the field, wherein the third and fourth target features respectively include third and fourth linear gratings, which are oriented along a second direction, which is not parallel with the first direction.

Additionally or alternatively, patterning the film layer includes forming a further instance of at least the first target feature within the first field in proximity to the first target feature, and wherein processing the image includes computing an alignment calibration function using the further instance of at least the first target feature, and applying the alignment calibration function in measuring the misalignment between the first and second fields. In a disclosed embodiment, the further instance of at least the first target feature includes a copy of the first target feature, which is adjacent to the first target feature, and computing the alignment calibration function includes measuring a relation in the image between the copy of the first target feature and the first target feature. Alternatively, the further instance of at least the first target feature includes a copy of both the first target feature and the second target feature.

In a disclosed embodiment, patterning the film layer includes defining a third field, which abuts the second field, with a third pattern including at least a third target feature within a third margin along a third edge of the third field, such that the third edge of the third field adjoins a fourth edge of the second field, and the second field includes a fourth target feature in the second margin adjacent to the third target feature on the third margin without overlapping the third target feature. The method includes capturing a further image including at least the third and fourth target features, and processing the further image to detect a further misalignment between the second and third fields.

Additionally or alternatively, the method includes measuring an angular misalignment of the semiconductor substrate, wherein processing the image includes correcting for the angular misalignment in estimating the misalignment between the first and second fields.

Further, additionally or alternatively, the first and second target features are used in measuring an overlay error between successive film layers on the semiconductor substrate.

There is also provided, in accordance with an embodiment of the invention, a product, including a semiconductor substrate and a film layer disposed on the substrate. The film layer is patterned to define a first field on the semiconductor substrate with a first pattern including at least a first target feature within a first margin along a first edge of the first field and a second field, which abuts the first field, with a second pattern including at least a second target feature within a second margin along a second edge of the second field, such that the second edge of the second field adjoins the first edge of the first field, and the first target feature in the first margin is adjacent to the second target feature in the second margin without overlapping the second target feature.

There is additionally provided, in accordance with an embodiment of the invention, apparatus for semiconductor metrology, including an imaging assembly, which is configured to capture images of a semiconductor substrate on which a film layer is disposed. The film layer is patterned to define a first field on the semiconductor substrate with a first pattern including at least a first target feature within a first margin along a first edge of the first field and a second field, which abuts but does not overlap with the first field, with a second pattern including at least a second target feature within a second margin along a second edge of the second field, such that the second edge of the second field adjoins the first edge of the first field, and the first target feature in the first margin is adjacent to the second target feature in the second margin without overlapping the second target feature. A processor is configured to process the image to detect a misalignment between the first and second fields.

The present invention will be more fully understood from the following detailed description of the embodiments thereof, taken together with the drawings in which:

BRIEF DESCRIPTION OF THE DRAWINGS

FIG. 6 is a schematic top view of the four exposure fields of FIG. 4, showing regions of interest for stitching error measurements, in accordance with an embodiment of the invention;

FIGS. 7A and 7B are each a schematic top view of two exposure fields with calibration targets, in accordance with two embodiments of the invention;

DETAILED DESCRIPTION OF EMBODIMENTS

Overview

Figure 1:
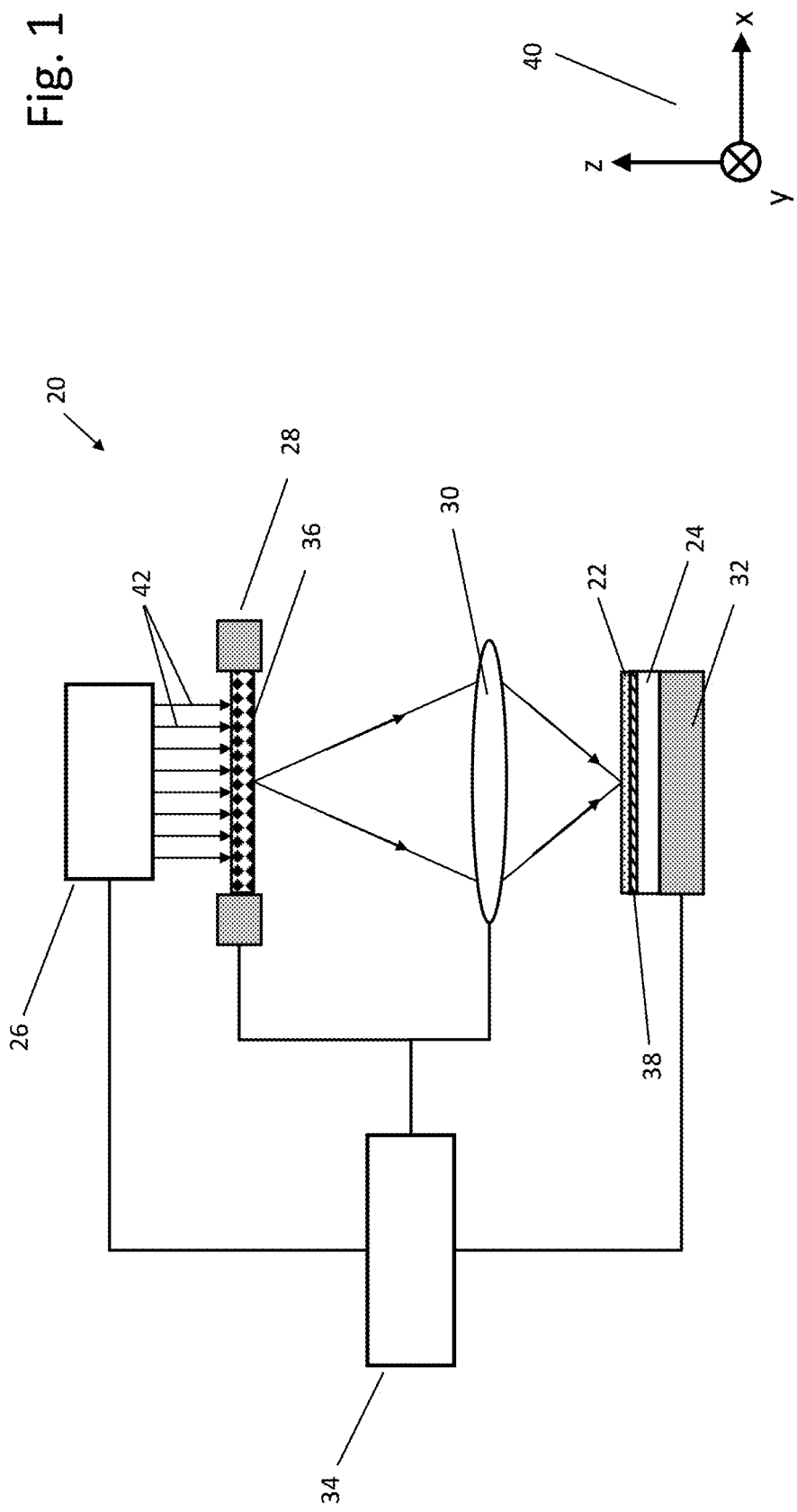
FIG. 1 is a schematic side view of an exposure system for patterning a photoresist layer on a semiconductor substrate, in accordance with an embodiment of the invention.

For semiconductor circuits in which two or more adjacent exposure fields define a single die, the stitching error between the fields, i.e., the misalignment between the fields, can cause critical circuit defects. Stitching errors can arise, for example, due to optical aberrations and scanner motion errors. To avoid loss of yield, it is important to detect and correct for stitching errors at an early stage in the process.

Whereas overlay metrology targets are commonly patterned with one target feature in an underlying process layer and the other in the photoresist layer, for stitching error measurements both features are patterned in the photoresist layer: One target feature is patterned when exposing one field, and the other feature is patterned when exposing the neighboring field. In overlay metrology targets, the target features in the photoresist layer typically overlap the corresponding target features in the underlying process layer. To emulate this model in stitching targets, however, requires that the margins of neighboring fields overlap with one another. This overlap entails a complicated double-exposure process.

The embodiments described hereinbelow address this problem by patterning neighboring fields that abut one another without substantial overlap, with metrology target features in the margins of the fields adjacent to the respective field edges. To measure the stitching error, each target comprises two "half-targets" on opposing sides of the boundary between a pair of abutting fields. The half-targets comprise respective target features, such as linear gratings, that are mutually adjacent without overlapping one another. The half-targets are non-overlapping in the sense that there is no area of overlap between the minimum bounding boxes containing the respective target features of the two half-targets.

Half-targets of this kind (for use in overlay metrology) are described in U.S. Patent Application 63/299,010, filed Jan. 13, 2022, whose disclosure is incorporated herein by reference.

For example, a target comprising two target features in the form of linear gratings oriented in the same grating direction can be patterned with one target feature at the edge one field and the other target feature at the edge of the neighboring field, with the features adjacent to each other across the border between the two fields. By employing two half-targets, with gratings orthogonal to one other and adjacent to the border, the stitching error between these two fields may be measured in two orthogonal directions.

Thus, in the disclosed examples, a film layer on a semiconductor substrate is patterned to define multiple fields, including at least first and second fields, which abut one another. The pattern of the first field comprises at least a first target feature within the margin of the first field, along the edge of the first field. (The term "margin" refers to a narrow band along the field edge, typically on the order to 10 µm in width, although narrower or broader margins may be used depending on the sizes of the target features.) The pattern of the second field comprises at least a second target feature within the margin of the second field, along the edge of the second field adjoining the edge of the first field. The target features are defined such that the first target feature in the margin of the first field is adjacent to the second target feature in the margin of the second field without overlapping the second target feature.

An imaging assembly captures an image of an area of the patterned film layer that contains the stitching metrology target, i.e., the image contains at least the first and second target features. A processor processes the image to detect misalignment between the first and second fields.

The patterns in the first and second fields may be different, or they may be identical, as long as they include the target features in the appropriate, adjoining locations in the field margins. In some embodiments, as described hereinbelow, this technique is extended to measure stitching errors between three or more neighboring fields.

Patterning

FIG. 1 is a schematic side view of an exposure system 20 for patterning a photoresist layer 22 on a semiconductor substrate 24, such as a silicon wafer, in accordance with an embodiment of the invention. Exposure system 20 is shown by way of example, and other sorts of exposure systems may alternatively be used.

Exposure system 20, representing in a simplified manner a scanner or a stepper, comprises an exposure light source 26, a mask stage 28, projection optics 30, a wafer stage 32, and an exposure system controller 34. A mask 36, defining a pattern in photoresist layer 22, is positioned in mask stage 28. Mask 36 includes target features within the margin along one or more edges of the pattern, for the purpose of measuring stitching error described as further hereinbelow.

Semiconductor substrate 24, having one or more process layers 38 and photoresist layer 22 deposited over its top surface, is positioned on wafer stage 32. The orientation of exposure system 20, as well as the orientation of the items in the figures hereinbelow, is referenced to Cartesian coordinates 40.

Exposure light source 26 emits optical radiation, indicated by arrows 42, to illuminate mask 36. The optical radiation typically comprises wavelengths in the ultra-violet (UV) or extreme ultra-violet (EUV) regime of spectrum. Although the emitted optical radiation in the figure is shown as uniform and collimated radiation, it may alternatively comprise radiation with a different spatial and/or angular distribution.

Mask stage 28 comprises actuators, controlled by exposure system controller 34, which can move the stage (and thus mask 36) linearly in the x-, y-, and z-directions, as well as rotate the stage around the z-axis and tilt it around the x- and y-axes. Mask 36 typically comprises a substrate such as quartz that is transparent to the optical radiation emitted by exposure light source 26, with patterns formed, in a thin film of suitable material on the substrate, to modulate the amplitude and/or phase of the optical radiation transmitted by the mask.

Projection optics 30 are shown for the sake of simplicity as a single lens, but typically comprise multiple lenses and/or mirrors, whose positions and orientations may be controlled by exposure system controller 34 for optimal optical performance.

Wafer stage 32 comprises actuators, controlled by exposure system controller 34, which can move the stage (and thus semiconductor substrate 24) linearly in the x-, y-, and z-directions, as well as rotate the stage around the z-axis.

Exposure system controller 34 is coupled to light source 26, mask stage 28, projection optics 30, and wafer stage 32. Controller 34 typically comprises a programmable processor, which is programmed in software and/or firmware to carry out the functions that are described herein, along with suitable digital and/or analog interfaces for connection to the other elements of exposure system 20. Alternatively or additionally, controller 34 comprises hard-wired and/or programmable hardware logic circuits, which carry out at least some of the functions of the controller. Although controller 34 is shown in FIG. 1, for the sake of simplicity, as a single, monolithic functional block, in practice the controller may comprise multiple, interconnected control units, with suitable interfaces for receiving and outputting the signals that are illustrated in the figures and are described in the text.

For the purpose of patterning photoresist layer 22, exposure system controller 34 moves wafer stage 32 under projection optics 30 so that photoresist layer 22 on semiconductor substrate 24 is in a desired position and orientation with respect to the optics. Exposure light source 26 emits optical radiation to illuminate mask 36. The optical radiation impinging on mask 36 is transmitted and/or diffracted by the mask and projected toward projection optics 30, which focuses the radiation onto photoresist layer 22 exposing the photoresist. The exposed area, termed an "exposure field" or "field," is defined by the image of mask 36 on semiconductor substrate 24. As noted earlier, each field contains target features within a margin along one or more edges of the field for purposes of stitching error metrology. After the exposure of a field, controller 34 moves wafer stage 32 in the xy-plane so that the next field may be exposed, as will be further detailed in FIG. 2. When a different pattern is required for the next field, for example for generating a die comprising multiple fields with different circuit patterns in each field, mask 36 is replaced by another, suitable mask before the exposure.

Once all required fields have been exposed, the photoresist layer is developed. After the development step, the stitching errors of the patterning between adjacent fields are measured using the target features in the margins, as described hereinbelow. Provided that the stitching errors comply with preset tolerances, process layer 38 is modified by methods such as etching and ion bombardment to change the material properties and/or the topography of the process layer, while the parts of the process layer covered by remaining parts of photoresist layer 22 are not affected.

In addition to measuring stitching errors between adjacent fields, the target features in the margins may also be used for measuring overlay errors between successive film layers on substrate 24, such as photoresist layer 22 and process layer 38, by providing corresponding target features in the margins of the process layer. Furthermore, the target features in the margins of process layer 38 may be used for measuring stitching errors between adjacent fields in the process layer.

Figure 2:
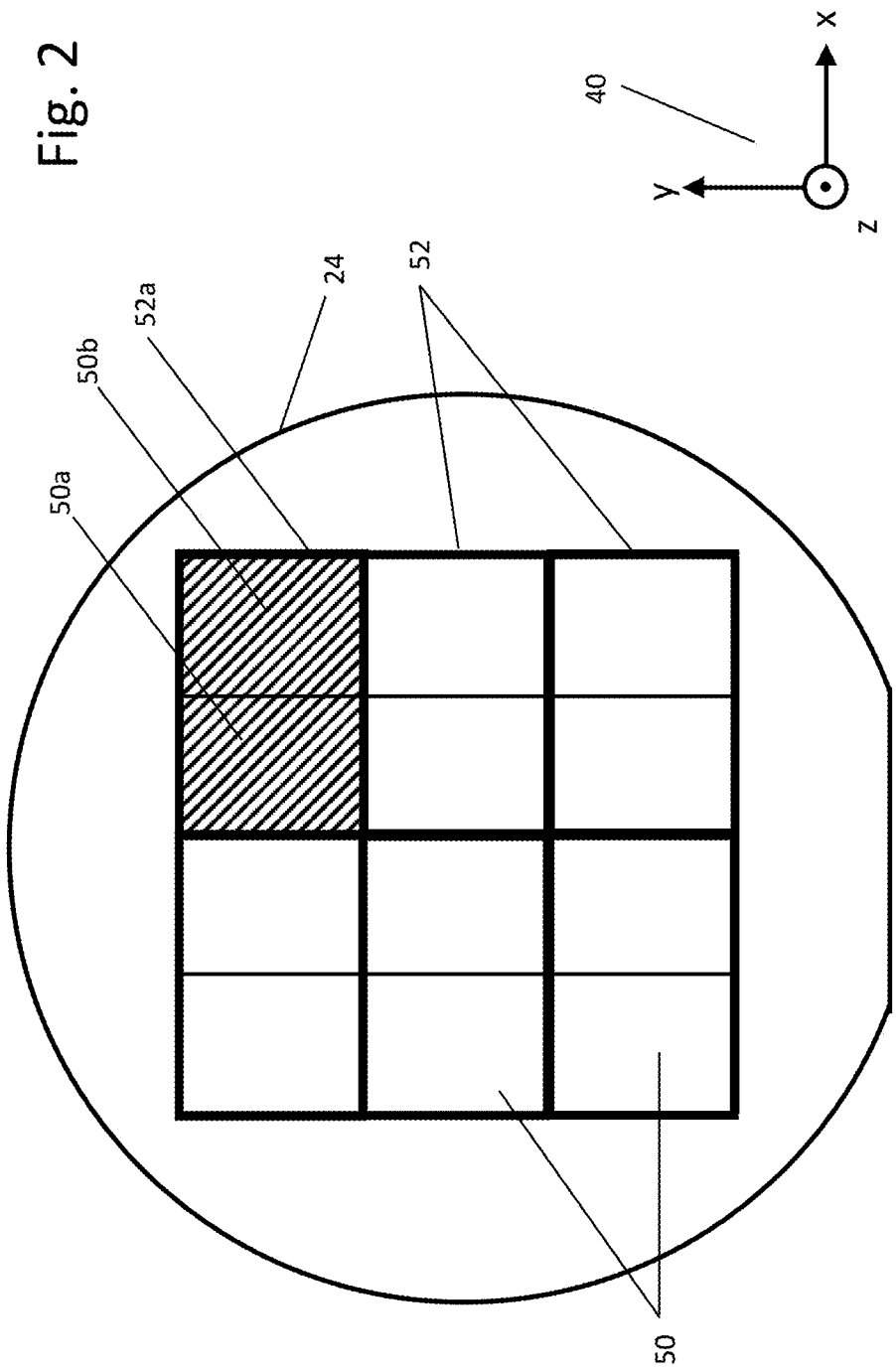
FIG. 2 is a schematic top view of patterned semiconductor substrate, in accordance with an embodiment of the invention.

FIG. 2 is a schematic top view of patterned semiconductor substrate 24, in accordance with an embodiment of the invention.

Semiconductor substrate 24 comprises exposure fields 50 that have been exposed by exposure system 20, as described hereinabove. Fields 50 have been exposed so that they abut each other with their adjacent edges touching but not substantially overlapping. In the pictured example, each dies 52 comprises a pair of adjacent fields 50. For example, fields 50a and 50b form a die 52a, shown by shading. (In alternative embodiments, more than two fields 50 may form a single die 52.) This combination of multiple fields 50 to form a single die 52 enables forming circuits that are larger than a single field of exposure system 20.

In order for the circuit in a given die 52 to be functional, i.e., to have functioning connections across a common border between the two fields forming the die, these fields need to be mutually aligned to a high degree of accuracy (typically of the order of 10 nm). For assuring this alignment, target features are patterned in the above-described patterning stage in the margins along the adjoining edges fields 50*a* and 50*b*. Alternatively, the target features may be patterned along two, three, or all four edges of each field, as will be described hereinbelow.

Figure 3:
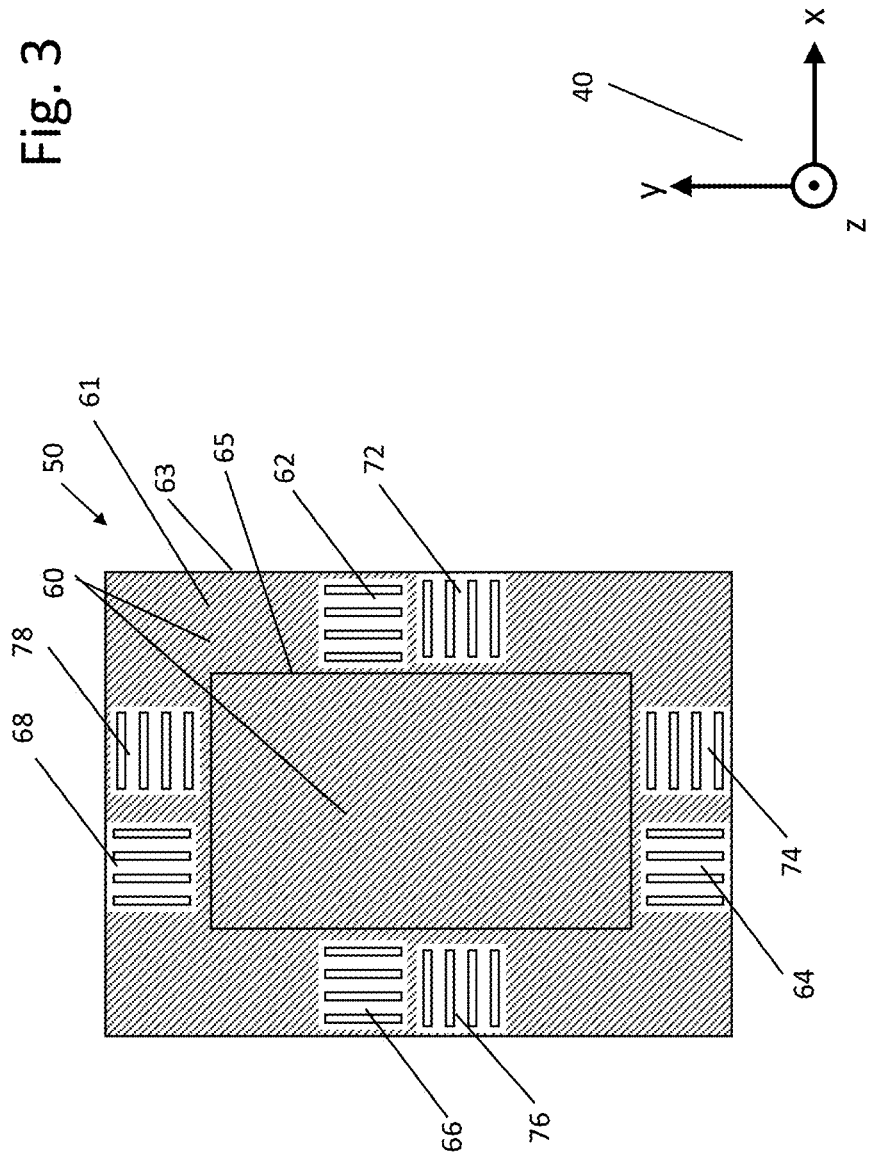
FIG. 3 is a schematic top view of an exposure field, in accordance with an embodiment of the invention.

FIG. 3 is a schematic top view of exposure field 50, in accordance with an embodiment of the invention.

Field 50 comprises a circuit area 60 that extends across the field to its edges, so as to enable the coupling of the circuits in the circuit area to one or more of neighboring fields. (For the sake of simplicity, the details of the electronic circuits in circuit area 60 are not shown in the current figure, and the label for circuit area 60 is omitted from the remaining figures.) A margin 61 of field comprises a frame-like area between an outer edge 63 of field 50 and an inner edge 65. Field 50 additionally comprises x-metrology target features 62, 64, 66, and 68, and y-metrology target features 72, 74, 76, and 78, with all target features positioned adjacent to outer edge 63 within margin 61.

In the pictured example, each target feature comprises a linear grating comprising four parallel, equispaced bars. Target features 62, 64, 66, and 68 are oriented in the y-direction, and target features 72, 74, 76, and 78 are oriented in the x-direction. Alternatively, target features 72, 74, 76, and 78 may be oriented at one or more different angles, as long as they are not parallel to target features 62, 64, 66, and 68.

In alternative embodiments, other target features that enable determining the position of the center of symmetry of the feature in either the x- or y-direction may be used.

Due to the requirement that circuit features in circuit area 60 of field 50 connect to at least one neighboring field, the circuit area extends into margin 61, thus sharing the margin with the target features.

For the sake of clarity, the dimensions of the target features 62, 64, 66, 68, 72, 74, 76, and 78 and margin 61 are exaggerated relative to the dimensions of field to 50: A typical field has dimensions in the range of tens of millimeters, whereas the target features typically have a size of 5 μm×5 μm or 10 μm×10 μm.

The target features are positioned in field 50 in such a way that, when patterning several adjacent fields, each target feature is nominally aligned with a similar target feature in an adjacent field, as will be further detailed hereinbelow. The meaning of the term "nominally aligned" is that when a stitching error is measured using a pair of adjacent target features, each belonging to an adjacent field 50, this error is zero when patterned by an ideal exposure system 20.

Since field 50 is patterned by exposure system 20 using mask 36, all fields patterned on semiconductor substrate 24 using this mask comprise identical patterns of circuits in circuit area 60 and x- and y-metrology target features 62, 64, 66, and 68 and 72, 74, 76, and 78, respectively, in the margins. When different masks are used to pattern different circuit features in different fields, each mask may still have the same pattern of metrology target features in order to enable measuring stitching errors as described in the present embodiments.

Figure 4:
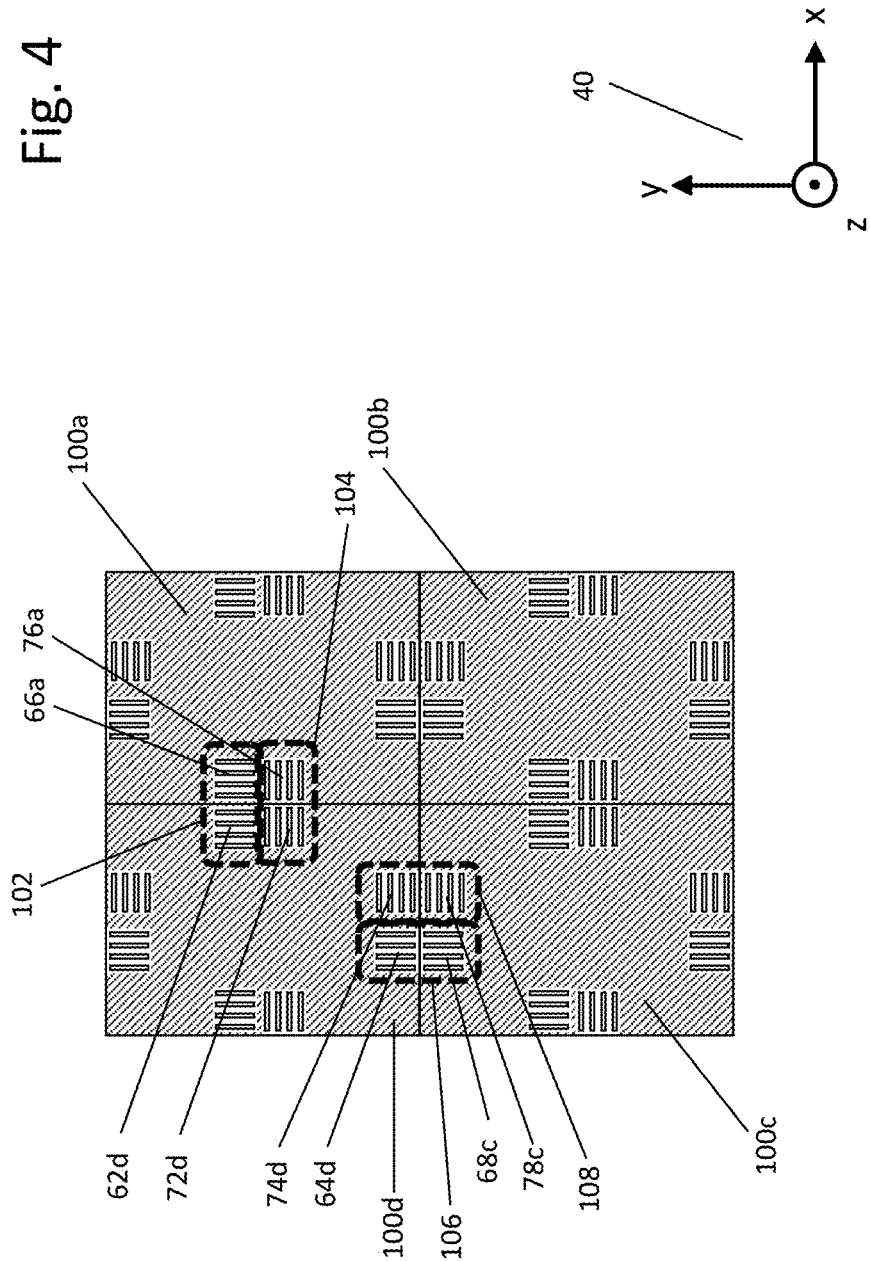
FIG. 4 is a schematic top view of four adjacent exposure fields, in accordance with an embodiment of the invention.

FIG. 4 is a schematic top view of four adjacent exposure fields 100*a*, 100*b*, 100*c*, and 100*d*, in accordance with an embodiment of the invention.

Each of the four fields comprises the four x-metrology target features and the four y-metrology target features shown in FIG. 3 for field 50. Following the labeling of the metrology target features of FIG. 3, x-metrology target features 66*a* and 62*d* form an x-metrology target 102, which enables measuring the x-stitching error, i.e., misalignment in the x-direction, between fields 100*a* and 100*d*. (Measuring the stitching error will be detailed hereinbelow.) Similarly, y-misalignment structures 76*a* and 72*d* form a y-metrology target 104, which enables measuring the y-stitching error between fields 100*a* and 100*d*. For measuring the x- and y-stitching errors between fields 100*c* and 100*d*, an x-metrology target 106 is formed by x-metrology target features 68*c* and 64*d*, and a y-metrology target 108 is formed by y-metrology target features 78*c* and 74*d*. For measuring the stitching errors between fields 100*a* and 100*b* and between fields 100*b* and 100*c*, metrology targets are similarly formed from the relevant target features. Stitching error metrology between four fields is shown here by way of example only, and the method may be limited to only two or three neighboring fields or expanded to an arbitrary number of adjacent fields.

As each metrology target is formed by two target features in adjacent fields, no overlap of the fields is required, thus simplifying the patterning of each field, especially for any circuit patterns in margin 61. Rather, the minimum bounding box containing any given target feature (i.e., the smallest rectangular area containing the entire target feature) has zero area of overlap with the minimum bounding boxes of the other target features in the same metrology target.

Metrology targets such as targets 102, 104, 106, and 108 in FIG. 4 are one-dimensional half-targets. Herein "one-dimensional" refers to the fact that they enable the measurement of a stitching error in one dimension only. The term "half-target" refers to the fact that these stitching error measurements may not be calibrated by a 0°/180° rotation, in contrast to "full targets" comprising multiple target features with a 180° symmetry around a normal to substrate 24 (for example, AIM™-targets by KLA Corporation (Milpitas, CA, USA).

In the description that follows, metrology targets such as targets 102 and 108, wherein the bars of the respective target features are positioned side by side along a direction perpendicular to the grating direction, will be hereinbelow termed "side-by-side targets." Metrology targets such as targets 104 and 106, wherein the bars of the respective target features are positioned head-to-head along the grating direction, will be termed "head-to-head targets." The principles of the present invention, however, are not limited to such targets. In alternative embodiments, for example, the target cells may be placed at non-orthogonal angles with respect to each other, and in some designs the targets may comprise diagonal bars.

Measurement of Stitching Error

Figure 5:
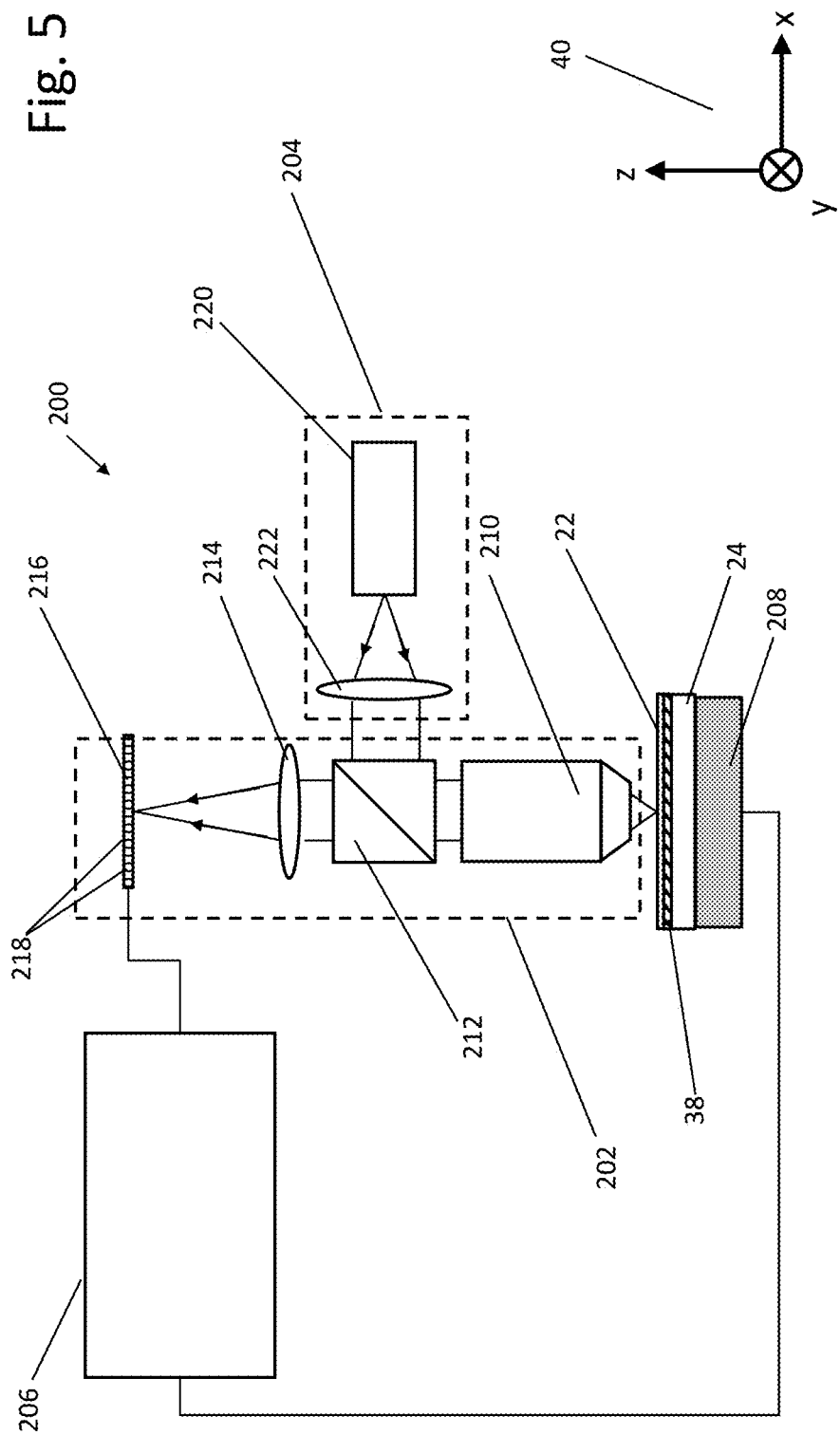
FIG. 5 is a schematic side view of an imaging metrology apparatus, in accordance with an embodiment of the invention.

FIG. 5 is a schematic side view of an imaging metrology apparatus 200, in accordance with an embodiment of the invention. Apparatus 200 is shown by way of example for illustrating methods of metrology and calibration in accordance with embodiments of the present invention. Alternatively, other sorts of metrology systems may be used.

Imaging metrology apparatus 200 comprises an imaging assembly 202, an illumination assembly 204, a metrology processor 206, and a table 208 on which semiconductor substrate 24 is mounted. Imaging assembly 202 comprises an objective lens 210, a cube beamsplitter 212, and an imaging lens 214. Imaging assembly 202 further comprises a two-dimensional sensor array 216, comprising for example, a complementary metal-oxide-semiconductor (CMOS) detector with a two-dimensional array of pixels 218. Imaging lens 214 images the top surface of semiconductor substrate 24 onto sensor array 216.

Illumination assembly 204 comprises a light source 220, emitting optical radiation, and a lens 222. Table 208 is located in proximity to objective lens 210, and comprises actuators, controlled by metrology processor 206, which can move the table linearly in the x-, y-, and z-directions, as well as rotate the table around the z-axis.

Semiconductor substrate 24, having process layer 38 and photoresist layer 22 deposited over its top surface, is positioned on table 208. Photoresist layer 22 has been patterned as described hereinabove.

Metrology processor 206 is coupled to sensor array 216 and to table 208. Metrology processor 206 typically comprises a programmable processor, which is programmed in software and/or firmware to carry out the functions that are described herein, along with suitable digital and/or analog interfaces for connection to the other elements of apparatus 200. Alternatively or additionally, processor 206 comprises hard-wired and/or programmable hardware logic circuits, which carry out at least some of the functions of the controller. Although processor 206 is shown in FIG. 5, for the sake of simplicity, as a single, monolithic functional block, in practice the controller may comprise multiple, interconnected control units, with suitable interfaces for receiving and outputting the signals that are illustrated in the figures and are described in the text. Program code or instructions for the metrology processor 206 to implement various methods and functions disclosed herein may be stored in readable storage media, such as a memory in the metrology processor 206 or other memory.

To capture an image of a metrology target in photoresist layer 22, semiconductor substrate 24 is positioned on table 208 and the table is moved so that the target is in the field of view (FOV) of objective lens 210. Light source 220 projects a beam of optical radiation to lens 222, which further projects the beam to cube beamsplitter 212. Beamsplitter 212 reflects the beam into objective lens 210, which projects the beam onto semiconductor substrate 24 illuminating the metrology target. The radiation impinging on semiconductor substrate 24 is reflected back to objective lens 210, and further focused by lens 214 onto sensor array 216. Metrology processor 206 captures the image and processes it in order to measure the stitching error, as is further detailed hereinbelow.

FIG. 6 is a schematic top view of the four exposure fields shown in FIG. 4, showing regions of interest for stitching error measurements, in accordance with an embodiment of the invention.

For measuring the x- and y-stitching errors between fields 100a and 100d and between fields 100c and 100d, metrology processor 206 moves table 208 so that each metrology target 102, 104, 106, and 108 is, in turn, positioned under objective lens 210 and imaged onto sensor array 216 (FIG. 5). For each metrology target 102, 104, 106, and 108, processor 206 defines a region of interest (ROI) over the target features forming the respective metrology target. (In FIG. 6 the ROIs are depicted as encompassing an entire target feature. Alternatively, each ROI may comprise only the inner parts of the respective target feature, thus excluding, for example, potentially irregular ends of bars.) The labeling of the ROIs is shown in Table 1:

TABLE 1

LABELING OF ROIS

| Metrology target | x-stitching error | | y-stitching error | |
|---|---|---|---|---|
| | Target feature | ROI | Target feature | ROI |
| 102 | 62d | 162d | | |
| | 66a | 166a | | |
| 104 | | | 72d | 172d |
| | | | 76a | 176a |
| 106 | 64d | 164d | | |
| | 68c | 168c | | |
| 108 | | | 74d | 174d |
| | | | 78c | 178c |

For each ROI, metrology processor 206 processes the portion of the image within the respective ROI and computes the positions of the centers of symmetry of the respective target features. Based on the positions of the centers of symmetry, processor 206 computes the x-stitching error ($STE_x$) and the y-stitching error ($STE_y$). As metrology targets 102, 104, 106, and 108 differ from each other in both structure and orientation, these computations are further detailed hereinbelow:

Metrology target 102—Processor 206 computes the respective centers of symmetry of the target features within ROIs 162d and 166a and the displacement $\Delta_x$ between the two centers of symmetry in the x-direction. (The displacement between the two centers of symmetry in the y-direction is determined by the positions of the two ROIs, and does not relate to the x-stitching error.) For side-by-side target features 62d and 66a, displacement $\Delta_x$ is the sum of the displacement $D_{nominal,x}$ and the stitching error $STE_x$, wherein $D_{nominal,x}$ is the nominal displacement between the centers of symmetry of the target features within ROIs 162d and 166a. Thus, $\Delta_x$ may be written as $\Delta_x = D_{nominal,x} + STE_x$, and the stitching error is computed by subtracting $D_{nominal,x}$ from the measured displacement $\Delta_x$: $STE_x = \Delta_x - D_{nominal,x}$. The nominal x-displacement $D_{nominal,x}$ is determined by processor 206 from the design dimensions of mask 36 as projected onto semiconductor substrate 24 in exposure system 20 and imaged onto sensor 216 in metrology system 200. In other words, $D_{nominal,x}$ depends on the nominal positions of the respective target features on the mask, the optical magnification of exposure system 20, and the nominal optical magnification of metrology apparatus 200.

Metrology target 104—Processor 206 computes the respective centers of symmetry of the target features within ROIs 172d and 176a and the displacement $\Delta_y$ between the centers of symmetry in the y-direction. (The displacement between the two centers of symmetry in the x-direction is determined by the positions of the two ROIs, and does not relate to the y-stitching error.) Head-to-head target features 72d and 76a are nominally aligned with respect to each other in the y-direction, and thus the displacement $\Delta_y$ gives the y-stitching error $STE_y$: $STE_y = \Delta_y$.

Metrology target 106—Processor 206 computes the respective centers of symmetry of the target features within ROIs 164d and 168c and the displacement $\Delta_x$ between the two centers of symmetry in the x-direction. (The displacement between the two centers of symmetry in the y-direction is determined by the positions of the two ROIs, and does not relate to the x-stitching error.) Similarly to metrology target 104, head-to-head target features 64d and 68c are nominally aligned with respect to each other in the x-direction, and thus the displacement $\Delta_x$ gives the x-stitching error $STE_x$:

$STE_x=\Delta_x$. Alternatively, using other target designs, such as diagonally oriented targets, a given target may simultaneously yield both x- and y-stitching errors.

Metrology target 108—Processor 206 computes the respective centers of symmetry of the target features within ROIs 174d and 178c and the displacement $\Delta_y$ between the two centers of symmetry in the y-direction. (The displacement between the two centers of symmetry in the x-direction is determined by the positions of the two ROIs, and does not relate to the y-stitching error.) For side-to-side target features 74d and 78c, the displacement $\Delta_y$ is the sum of the nominal y-displacement $D_{nominal,y}$ between the centers of symmetry of ROIs 174d and 178c, and the stitching error $STE_y$: $\Delta_y=D_{nominal,y}+STE_y$. Thus, the stitching error is computed by subtracting $D_{nominal,y}$ from the measured displacement $\Delta_y$: $STE_y=\Delta_y-D_{nominal,y}$. The nominal y-displacement $D_{nominal,y}$ is determined by processor 206 from the design dimensions of mask 36, similarly to $D_{nominal,x}$ as described hereinabove.

The stitching errors between fields 100a and 100b and between fields 100b and 100c are measured in a similar fashion.

Figure 7B:
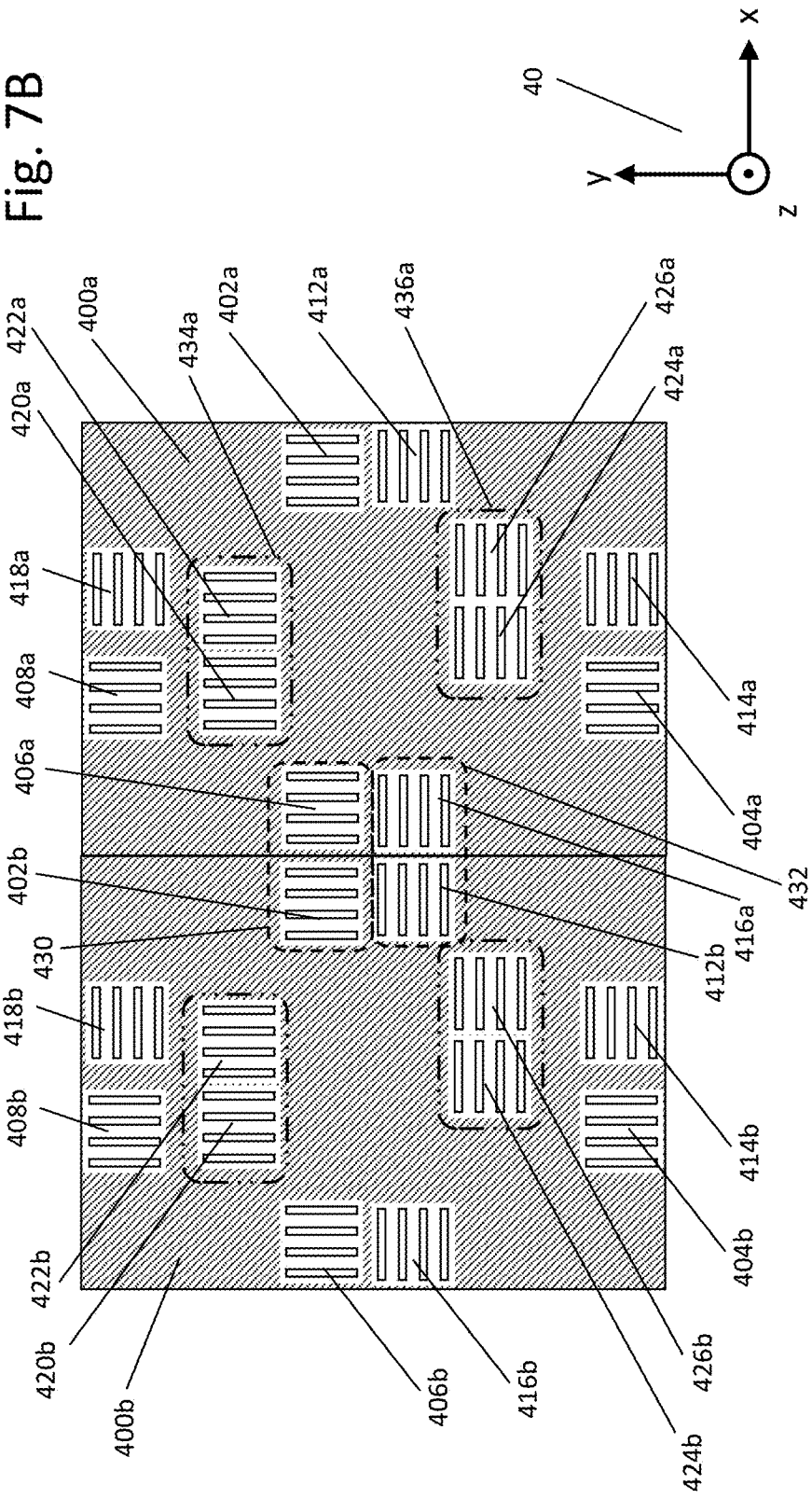

FIGS. 7A and 7B are each a schematic top view of two exposure fields with calibration targets, in accordance with two embodiments of the invention. In the embodiment shown in FIG. 7A, the calibration targets are integrated with the metrology targets, whereas in the embodiment shown in FIG. 7B, the calibration targets are separated from the metrology targets.

Stitching errors $STE_x$ and $STE_y$, as measured by overlay metrology apparatus 200, may have measurement errors due optical aberrations of imaging assembly 202 of the apparatus, as well as due to a magnification error $\Delta M$ relative to the nominal optical magnification M of an ideal imaging assembly. As described hereinabove (in reference to FIG. 6), the nominal displacements $D_{nominal,x}$ and $D_{nominal,y}$ between the centers of symmetry of the ROIs of side-by-side metrology targets (such as targets 102 and 108) are used to compute the stitching errors $STE_x$ and $STE_y$. A magnification error of $\Delta M$ leads to errors of $(\Delta M/M) \times D_{nominal,x}$ and $(\Delta M/M) \times D_{nominal,y}$ in the measured stitching errors $STE_x$ and $STE_y$. For example, a 0.1% relative error $\Delta M/M$ and a nominal value of 5 μm for $D_{nominal,x}$ leads to an error of 5 nm in $STE_x$, which is significant as compared to a typical total stitching error budget of 5-10 nm.

Another source of errors in the stitching error measurement is angular misalignment of the target features with respect to Cartesian coordinates 40, as is further detailed in FIG. 8 hereinbelow. Due to these error sources, it is desirable to calibrate the stitching error measurements. Two alternative methods for calibration are shown in FIGS. 7A and 7B.

FIG. 7A shows two exposure fields 300a and 300b. Exposure field 300a comprises target features 302a, 304a, 306a, and 308a for x-misalignment measurements, and target features 312a, 314a, and 318a for y-misalignment measurements. Exposure field 300b comprises similar target features, identified by the letter "b" in their labels. Exposure field 300a comprises calibration target features 320a and 322a, with similar calibration target features 320b and 322b added to field 300b.

A calibration procedure is described hereinbelow, by way of example, for metrology targets 330 and 332. Metrology target 330 comprises target features 302b and 306a for measuring x-stitching error between fields 300a and 300b, and metrology target 332 comprises target features 312b and 316a for measuring y-stitching error between these two fields.

Calibration target feature 320a, used for calibrating x-misalignment measurements, is a copy of target feature 306a, and is positioned adjacent to target feature 306a with a shift in the x-direction so that these two target features together form a metrology target 334, which is contained entirely within field 300a. The displacement in the x-direction between the centers of symmetry of target features 306a and 320 is the same as the nominal displacement between the centers of symmetry of target features 302b and 306a. For calibrating the x-misalignment measured using target 330 by metrology apparatus 200, the apparatus also measures x-misalignment in target 334. As the entire target 334 is patterned in one field (field 300a), its x-stitching error is known to be zero. Any non-zero x-misalignment in target 334 is due to the above-described error sources (optical aberrations and magnification error of apparatus 200 and angular misalignment of target features), and thus provides an x-misalignment calibration. As this error manifests itself similarly in the x-stitching error measurement of target 330, this measurement, including magnification error, may be corrected using the x-misalignment calibration measured using target 334.

Calibration target feature 322b, used for calibrating y-misalignment measurements, is a copy of target feature 312b and is positioned adjacent to target feature 312b with a shift in the x-direction so that these two target features together form a metrology target 336. For calibrating the y-misalignment measured using target 332 by metrology apparatus 200, the apparatus also measures the y-misalignment in target 336. Similarly to target 334, the y-stitching error of target 336 known to be zero. Any non-zero misalignment in target 336 is again due to the above-described error sources (optical aberrations of apparatus 200 and angular misalignment of target features; magnification error is not relevant for head-to-head metrology target 332), and provides a y-misalignment calibration. As this error manifests itself similarly in the y-stitching error measurement of target 332, this measurement may be corrected using the y-misalignment calibration measured using target 336.

For the sake of simplicity, only calibration target features shifted in the x-direction are shown in FIG. 7A for each field. Other calibration target features, similar to the x-shifted calibration features but shifted in the y-direction, may be added adjacent to the other measurement target features for misalignment calibration.

FIG. 7B shows two exposure fields 400a and 400b. Exposure field 400a comprises target features 402a, 404a, 406a, and 408a for x-misalignment measurements, and target features 412a, 414a, 416a, and 418a for y-misalignment measurements. Exposure field 400b comprises similar target features, identified by the letter "b" in their labels. Exposure field 400a comprises calibration target features 420a, 422a, 424a, and 426a, with similar target features 420b, 422b, 424b, and 426b added to field 400b.

A calibration procedure is described, by way of example, for metrology targets 430 and 432. Metrology target 430 comprises target features 402b and 406a for measuring x-stitching error between fields 400a and 400b, and metrology target 432 comprises target features 412b and 416a for measuring y-stitching error between these two fields.

Calibration target features 420a and 422a are positioned in field 400a so as to form a calibration target 434a, which is nominally identical to metrology target 430, including the displacement between the centers of symmetry of the target features. Thus, calibration target 434a may be used to measure an x-misalignment calibration and to calibrate the x-misalignment measurement using metrology target 430 similarly to the use of target 334 for calibrating the x-misalignment measurement using target 330 (FIG. 7A).

Similarly, calibration target features 424a and 426a are positioned in field 400a so as to form a calibration target 436a, which is nominally identical to metrology target 432. Thus, calibration target 436a may be used to measure y-misalignment calibration and to calibrate the y-misalignment measurement using target 432, similarly to the use of target 336 for calibrating the y-misalignment measurement using target 332 (FIG. 7A).

In the calibration targets in FIG. 7B, the target features are shifted in the x-direction with respect to one another. Other calibration target features, similar to the x-shifted calibration features but shifted in the y-direction, may be added adjacent to the other measurement target features for misalignment calibration.

When the gratings of the two target features forming a metrology target have unequal pitches, a calibration step before those shown in FIG. 7A or 7B may be performed. This step comprises measuring the stitching error with the target in two orientations, separated by a 180° rotation around the z-axis, yielding x-stitching errors of $STE_{x, 0°}$ and $STE_{x, 180°}$ for the two orientations and y-stitching errors of $STE_{y, 0°}$ and $STE_{y, 180°}$ for the two orientations. In a first calibration step, calibrated x- and y-stitching errors are computed as $STE_{x, CAL1} = (STE_{x, 0°} - STE_{x, 180°})/2$ and $STE_{y, CAL1} = (STE_{y, 0°} - STE_{x, 180°})/2$. A second calibration step is then performed using the methods described above.

When multiple metrology targets are utilized for measuring the same stitching error, for example the x-misalignment between fields 300a and 300b (FIG. 7A) or fields 400a and 400b (FIG. 7B), the respective x-misalignment calibrations may be used for all of these targets.

Figure 8:
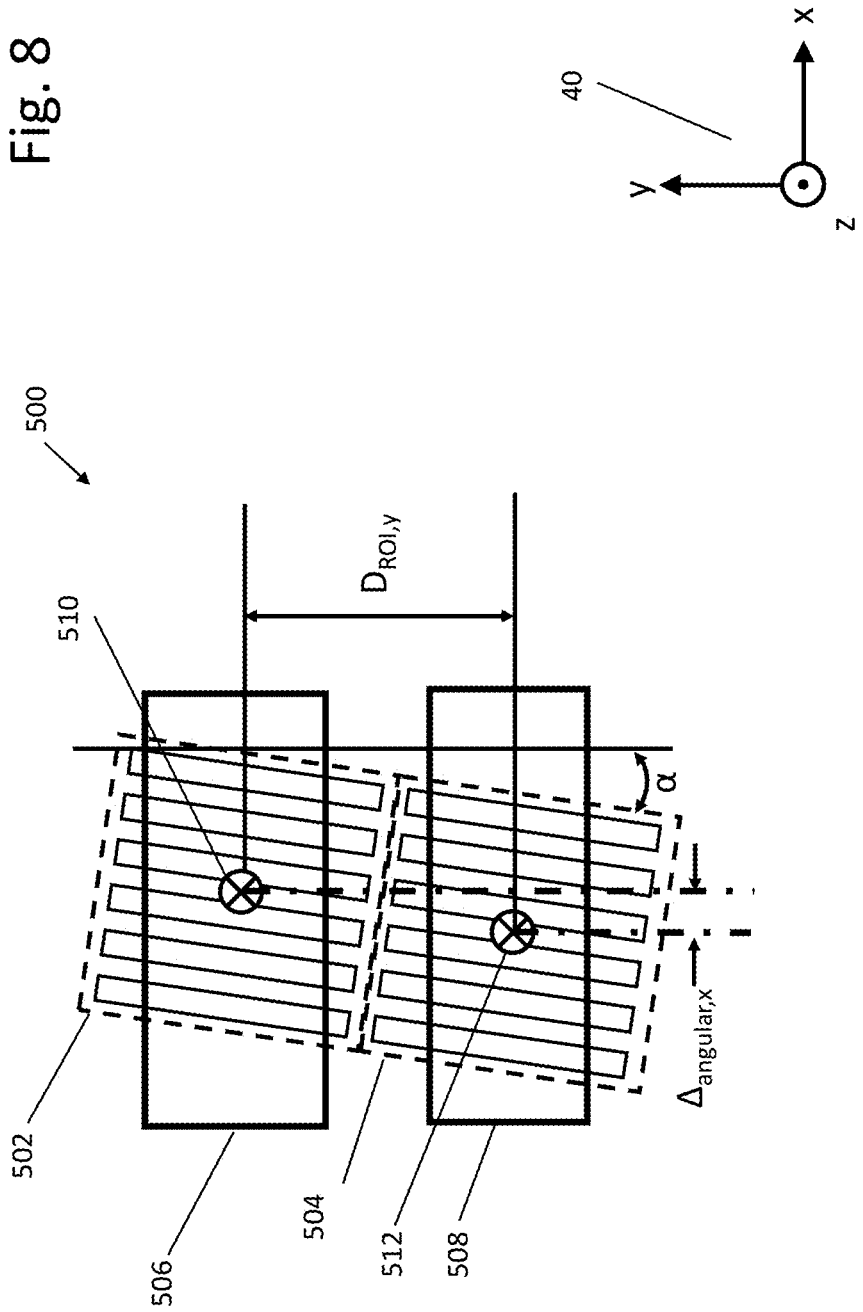
FIG. 8 is a schematic top view of an angularly misaligned metrology target, in accordance with an embodiment of the invention.

FIG. 8 is a schematic top view of an angularly misaligned metrology target 500, in accordance with an embodiment of the invention.

Although the angular misalignment of a metrology target may be calibrated as described hereinabove, additional local angular misalignments may be introduced in measuring the stitching error using each metrology target with apparatus 200. Table 208 moves semiconductor substrate 24 in the xy-plane to bring each target in turn under objective lens 210, and may during this movement introduce angular misalignment, or yaw errors. These local yaw errors of table 208 may be measured by using, for example, an interferometric measurement of the yaw angle of the table. Once the yaw angle is known, it may be used for an additional calibration of the stitching error measurement, as detailed hereinbelow.

Metrology target 500 is a head-to-head one-dimensional half-target, comprising six parallel, equispaced bars in two target features, 502 and 504, for measuring x-stitching error. Target 500 is rotated by a yaw angle $\alpha$ with respect to Cartesian coordinates 40. For the purpose of showing the error in the measured x-stitching error $STE_x$, target 500 has zero x-misalignment, i.e., were the target not rotated, target features 502 and 504 would be aligned with each other with zero shift in the x-direction. $STE_x$ is measured using target 500 by metrology apparatus 200. For the purpose, as described hereinabove, metrology processor 206 defines ROIs 506 and 508 over respective target features 502 and 504, and finds respective centers of symmetry 510 and 512 of the target features. For a displacement of $D_{ROI,y}$ between centers of symmetry 510 and 512, a rotation of $\alpha$ introduces a displacement of $\Delta_{angular,x} = \alpha \times D_{ROI, y}$ in the displacement between the centers of symmetry in the x-direction, wherein a small-angle approximation has been used. For example, for $\alpha=1$ mrad, and $D_{ROI, y}=5$ μm, $\Delta_{angular, x}=5$ nm. This error manifests itself directly in an x-misalignment measurement $STE_x$ measured from targets such as target 500, and $\Delta_{angular, x}$ may be used as an x-misalignment calibration for the measured x-stitching error $STE_x$. For side-by-side targets such as target 104 (FIG. 4), a typical yaw angle of table 208 has a negligible error.

Figure 9:
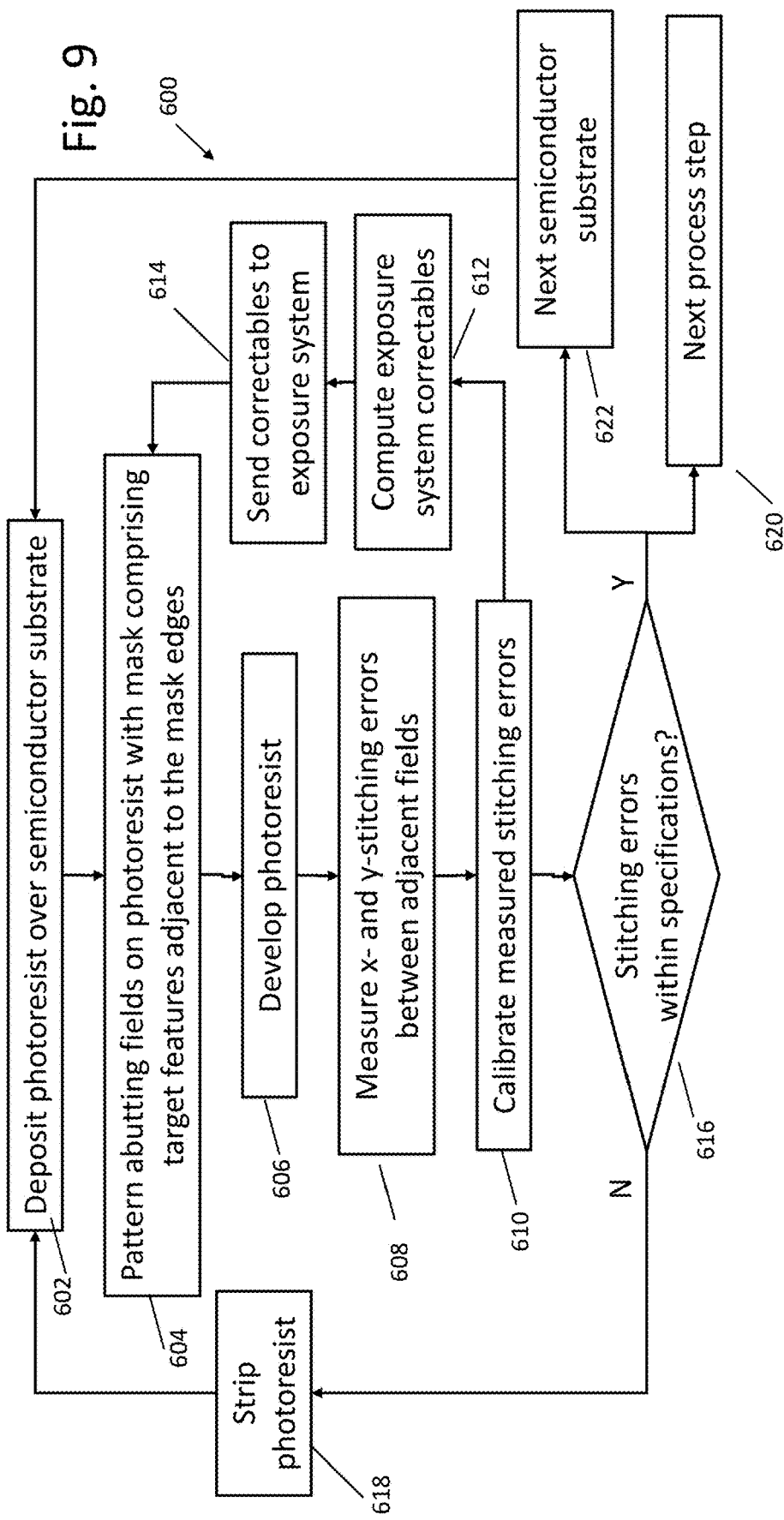
FIG. 9 is a flowchart that schematically illustrates a method for patterning multiple fields on a semiconductor substrate and measuring stitching error between adjacent fields, in accordance with an embodiment of the invention.

FIG. 9 is a flowchart 600 that schematically illustrates a method for patterning multiple fields on a semiconductor substrate and measuring stitching error between adjacent fields, in accordance with an embodiment of the invention.

In a deposition step 602, a photoresist layer 22 (FIG. 1) is deposited over semiconductor substrate 24. In a patterning step 604, adjacent but non-overlapping fields are patterned on substrate 24 using mask 36 in exposure system 20. In a development step 606, photoresist layer 22 is developed to generate the features defined by mask 36, including metrology target features.

In a stitching error measurement step 608, the x- and y-stitching errors are measured by imaging metrology apparatus 200 (FIG. 5) using the metrology target features. In a calibration step 610, the measured stitching errors are calibrated using the methods described hereinabove with reference to FIGS. 7A-7B and 8. In a correctable computation step 612, metrology processor 206 computes from the measured stitching errors correction values (sometimes referred to as "correctables") for application in exposure system 20 in order to reduce the stitching errors that were produced in the patterning process. In a correction step 614, the computed correction values are sent to exposure system 20.

In a decision step 616, the calibrated stitching errors are compared to preset stitching error tolerances. When the stitching errors are not within the preset tolerances, photoresist layer 22 is removed from substrate 24 in a strip step 618, and the substrate is sent back to step 602. When the stitching errors conform to the tolerances, semiconductor substrate 24 continues to a next process step 620, and the patterning process continues via a next substrate step 622 to step 602.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method of semiconductor metrology, comprising:
patterning a film layer on a semiconductor substrate to define a first field on the semiconductor substrate with a first pattern comprising at least a first target feature within a first margin along a first edge of the first field;
patterning the film layer on the semiconductor substrate to define a second field, which abuts the first field, with a second pattern comprising at least a second target feature within a second margin along a second edge of the second field, such that the second edge of the second field adjoins the first edge of the first field, and the first target feature in the first margin is adjacent to the second target feature in the second margin without overlapping the second target feature;

capturing an image of an area of the patterned film layer including at least the first and second target features; and processing the image to detect a misalignment between the first field and the second field.

2. The method according to claim 1, wherein processing the image comprises finding respective first and second centers of symmetry of the first target feature and the second target feature, measuring a displacement between the first and second centers of symmetry, and detecting the misalignment by comparing the measured displacement to a nominal displacement.

3. The method according to claim 1, wherein the first and second target features respectively comprise first and second linear gratings, which are oriented along a common grating direction.

4. The method according to claim 3, wherein the first and second linear gratings are oriented along a first grating direction, and wherein patterning the film layer comprises forming third and fourth target features along the first edge of the first field and the second edge of the second field, respectively, within a margin on opposing first and second sides of the field, wherein the third and fourth target features respectively comprise third and fourth linear gratings, which are oriented along a second direction, which is not parallel with the first direction.

5. The method according to claim 1, wherein patterning the film layer comprises forming a further instance of at least the first target feature within the first field in proximity to the first target feature, and wherein processing the image comprises computing an alignment calibration function using the further instance of at least the first target feature, and applying the alignment calibration function in measuring the misalignment between the first field and the second field.

6. The method according to claim 5, wherein the further instance of at least the first target feature comprises a copy of the first target feature, which is adjacent to the first target feature, and wherein computing the alignment calibration function comprises measuring a relation in the image between the copy of the first target feature and the first target feature.

7. The method according to claim 5, wherein the further instance of at least the first target feature comprises a copy of both the first target feature and the second target feature.

8. The method according to claim 1, wherein patterning the film layer comprises defining a third field, which abuts the second field, with a third pattern comprising at least a third target feature within a third margin along a third edge of the third field, such that the third edge of the third field adjoins a fourth edge of the second field, and the second field comprises a fourth target feature in the second margin adjacent to the third target feature on the third margin without overlapping the third target feature, and
    wherein the method comprises capturing a further image including at least the third and fourth target features, and processing the further image to detect a further misalignment between the second field and the third field.

9. The method according to claim 1, further comprising measuring an angular misalignment of the semiconductor substrate, wherein processing the image comprises correcting for the angular misalignment in estimating the misalignment between the first and second fields.

10. The method according to claim 1, further comprising applying the first and second target features in measuring an overlay error between successive film layers on the semiconductor substrate.

11. A product, comprising:
a semiconductor substrate; and
a film layer disposed on the substrate patterned to define:
    a first field on the semiconductor substrate with a first pattern comprising at least a first target feature within a first margin along a first edge of the first field; and
    a second field, which abuts the first field, with a second pattern comprising at least a second target feature within a second margin along a second edge of the second field, such that the second edge of the second field adjoins the first edge of the first field, and the first target feature in the first margin is adjacent to the second target feature in the second margin without overlapping the second target feature.

12. The product according to claim 11, wherein the first and second target features respectively comprise first and second linear gratings, which are oriented along a common grating direction.

13. The product according to claim 12, wherein the first and second linear gratings are oriented along a first grating direction, and wherein the film layer is patterned to form third and fourth target features along the first edge of the first field and the second edge of the second field, respectively, within a margin on opposing first and second sides of the field, wherein the third and fourth target features respectively comprise third and fourth linear gratings, which are oriented along a second direction, which is not parallel with the first direction.

14. The product according to claim 11, wherein the film layer is patterned to form a further instance of at least the first target feature within the first field in proximity to the first target feature.

15. The product according to claim 14, wherein the further instance of at least the first target feature comprises a copy of the first target feature, which is adjacent to the first target feature.

16. The product according to claim 15, wherein the further instance of at least the first target feature comprises a copy of both the first target feature and the second target feature.

17. The product according to claim 11, wherein the film layer is patterned to define a third field, which abuts but does not overlap with the second field, with a third pattern comprising at least a third target feature within a third margin along a third edge of the third field, such that the third edge of the third field adjoins a fourth edge of the second field, and the second field comprises a fourth target feature in the second margin adjacent to the third target feature on the third margin without overlapping the third target feature.

18. An apparatus for semiconductor metrology, comprising:
    an imaging assembly, which is configured to capture images of a semiconductor substrate on which a film layer is disposed and is patterned to define:
    a first field on the semiconductor substrate with a first pattern comprising at least a first target feature within a first margin along a first edge of the first field; and
    a second field, which abuts but does not overlap with the first field, with a second pattern comprising at least a second target feature within a second margin along a second edge of the second field, such that the second edge of the second field adjoins the first edge of the first field, and the first target feature in the first margin is adjacent to the second target feature in the second margin without overlapping the second target feature; and a processor, which is configured to process the image to detect a misalignment between the first field and the second field.

19. The apparatus according to claim 18, wherein the processor is configured to find respective first and second centers of symmetry of the first target feature and the second target feature, to measure a displacement between the first and second centers of symmetry, and to detect the misalignment by comparing the measured displacement to a nominal displacement.

20. The apparatus according to claim 18, wherein the film layer is patterned to form a further instance of at least the first target feature within the first field in proximity to the first target feature, and wherein the processor is configured to compute an alignment calibration function using the further instance of at least the first target feature, and to apply the alignment calibration function in measuring the misalignment between the first and second fields.

21. The apparatus according to claim 20, wherein the further instance of at least the first target feature comprises a copy of the first target feature, which is adjacent to the first target feature, and wherein the processor is configured to measure a relation in the image between the copy of the first target feature and the first target feature and to apply the relation in measuring the misalignment.

22. The apparatus according to claim 18, wherein the processor is configured to measure an angular misalignment of the semiconductor substrate, and to correct for the angular misalignment in estimating the misalignment between the first and second fields.

* * * * *